United States Patent [19]

Shenoi et al.

[11] 4,439,756
[45] Mar. 27, 1984

[54] DELTA-SIGMA MODULATOR WITH SWITCH CAPACITOR IMPLEMENTATION

[75] Inventors: Kishan Shenoi, Fairfield; Bhagwati P. Agrawal, Shelton, both of Conn.

[73] Assignee: International Telephone and Telegraph Corporation, New York, N.Y.

[21] Appl. No.: 340,931

[22] Filed: Jan. 20, 1982

[51] Int. Cl.³ .............................................. H03K 13/20
[52] U.S. Cl. ..................... 340/347 AD; 340/347 NT; 340/347 M; 375/28
[58] Field of Search .... 340/347 M, 347 AD, 347 NT; 375/28

[56] References Cited

U.S. PATENT DOCUMENTS 4,009,475 2/1977 DeFreitas .................... 340/347 AD
4,270,027 5/1981 Agrawal et al. .................. 179/81 R

OTHER PUBLICATIONS

The Engineering Staff of Analog Devices, Inc., ANALOG-DIGITAL CONVERSION HANDBOOK, 6/72, pp. I-6 and 7; III-78 to 81.

Primary Examiner—T. J. Sloyan
Attorney, Agent, or Firm—John T. O'Halloran; Jeffery P. Morris

[57] ABSTRACT

A Delta-Sigma ΔΣ modulator for one-bit analog to digital conversion of a signal, such as a telephone voice channel switch to digital form is disclosed. The circuit incorporates integration operative as low-pass filtering. The voice signal is sampled at a rate high compared to the highest voice channel frequency component. Sampled instantaneous signal values are integrated, re-sampled and again integrated to reduce encoding noise. Finally, a bi-level sense identifying circuit links the second integrator output to a D type flip-flop providing the one-bit encoded output.

The sampling and integrator control is effected by switching in a capacitor charge shifting arrangement under clock control and feedback is applied as a capacitor switching program modifications.

13 Claims, 6 Drawing Figures

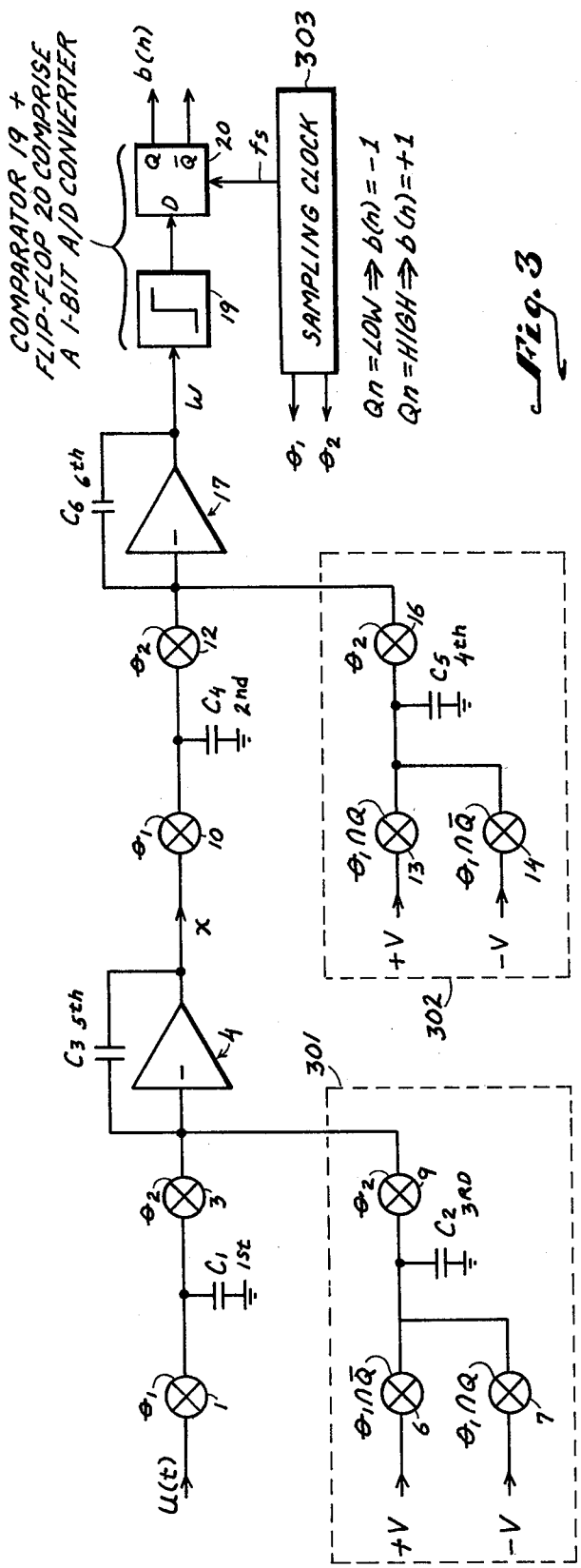
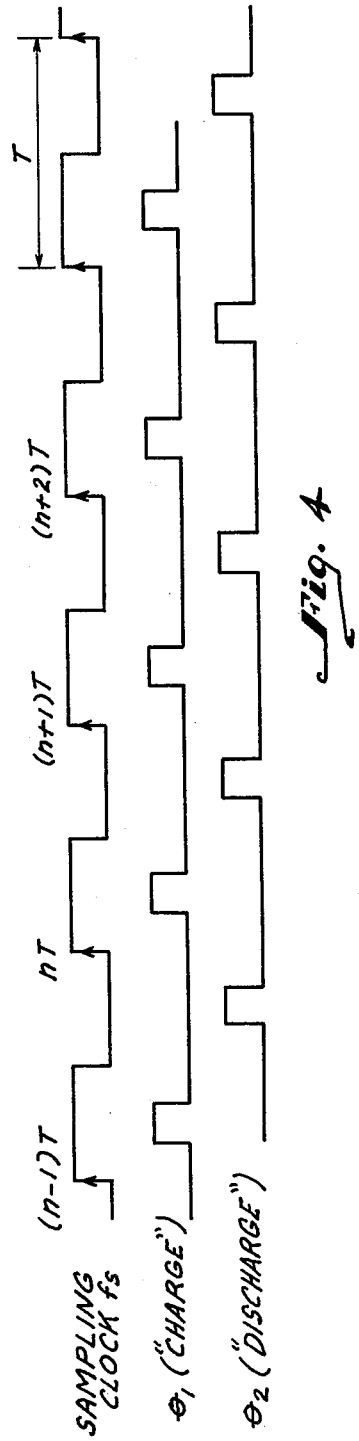
Fig. 3
Fig. 4

DELTA-SIGMA MODULATOR WITH SWITCH CAPACITOR IMPLEMENTATION

BACKGROUND OF THE INVENTION

1. Field of the Invention

The invention relates to analog to digital converters generally and to the so-called delta-sigma modulators more specifically.

2. Description of the Prior Art

Modern information transmission systems are often based on the conversion of analog input signals to digital signals for transmission over a discrete channel. Both the analog to digital and digital to analog subsequent reconstruction are subject to errors because the continuum of possible input values must be represented by discrete sets of values in the transmission channel. This error is commonly known as quantizing noise and constitutes one of the major sources of inaccuracies in such systems.

In a technical paper (herein called paper No. 1) entitled "Reduction of Quantizing Noise by Use of Feedback," H. A. Spang III and P. M. Schultheiss analysed the quantizing noise problem and suggested the use of quantizer feedback as a means of ameliorating the inaccuracies produced by this quantizing noise. That paper appeared in the IRE Transactions on Communication Systems, Vol. CS-10, pp. 373–380 (December 1962). Therein, a general case delta-sigma modulator having a multi-level quantizing characteristic is discussed and analyzed. Presumably, for simplicity of analysis, the authors of that technical paper have chosen to show the sampler and quantizer portions of the delta-sigma modulator as distinct entities. A physical configuration of that type cannot be implemented by conventional analog circuitry. An example of a conventional analog delta-sigma modulator is shown and described in a paper (hereinafter called paper No. 2) entitled "A Telemetering System by Code Modulation - Delta-Sigma ($\Delta\Sigma$)Modulation - Delta-Sigma ($\Delta\Sigma$) Modulation" by H. Inose, Y. Yasuda and J. Murakami. That paper was published in the IRE Transactions Space Electronics Telemetry, Vol. SET-8, pp. 204–209 (September 1962). In this latter paper the prior art, basically analog, delta-sigma ($\Delta\Sigma$) modulator is presented and its utility as an improvement over the prior art delta modulator is described.

The authors of the latter paper have pointed out that in the still earlier, so-called delta modulation system, pulses are sent over a transmission line carrying information corresponding to the derivative of the input signal amplitude. At the receiving end, those pulses are integrated to obtain the original waveform. Transmission disturbances such as noise, etc., result in a cumulative error as a transmitted signal is integrated at the receiving end.

The so-called delta-sigma modulation system provides for integration of the input signal before it enters the modulator itself so that the output transmitted pulses carry information corresponding to the amplitude of the input signal.

In a basically analog implementation, the behavior of a delta-sigma modulator depends on the absolute value of capacitors and resistors in the circuits and, therefore, sensitivity to the detrimental effects of aging and temperature is encountered. Further, operational amplifiers included in analog implementations must be of superior quality, the gain and bandwidth of such amplifiers should not be such as to affect the transfer function of the integrator within the input circuitry of the device. Still further, in an analog implementation the waveform at the output of the digital to analog converter has to be precise and not pattern sensitive, that is, a pulse for an isolated "1" must be substantially identical to pulses imbedded in a series of "1-s". The circuit intricacies of analog delta-sigma modulator implementations are often the result of that requirement.

The manner in which the invention deals with these prior art disadvantages will be evident as this description proceeds. A detailed description of a digital delta-sigma modulator can be found in Applicant's U.S. Pat. No. 4,270,027, entitled "Telephone Subscriber Line Unit with Sigma-Delta Digital-to-Analog Converter", which patent is assigned to the same assignee as is the instant invention.

SUMMARY OF THE INVENTION

In view of the disadvantages of the prior art basically analog delta-sigma modulator, it is the general objective of the present invention to provide a delta-sigma modulator in which performance does not depend on the absolute value of capacitors and resistors as is the case with the prior art analog implementations, but rather depends on the ratios of capacitors. These ratios are relatively unaffected by temperature variations and aging. Further, according to the switched capacitor implementation of the invention, operational amplifiers employed need only be able to charge and discharge circuit capacitors in a nominal time (on the order of one-half the sampling interval). This results in insensitivity to drift of element values caused by temperature and aging.

Still further, according to the invention, the switched capacitor implementation is based on an operational sequence of alternate charge and discharge of capacitors in non-overlapping intervals of time, such that a digital delta-sigma modulator of the type described in the aforementioned U.S. Pat. No. 4,270,027 is inherently pattern insensitive. That is, an isolated logical "1" is equivalent to a logical "1" in a string of logical "1"'s in terms of charge transfer.

Absolute values of capacitors can be chosen so that the design of operational amplifiers is more flexible. The Delta-Sigma modulating characteristics are affected only by the ratio of capacitors. For example, the larger the value of a capacitor, the larger is the slew rate requirement on the operational amplifier which is charging the capacitor. However, the stray capacitance will be more effectively swamped. Conversely, a small capacitance is more easily charged, but the effect of stray capacitance is more pronounced. By leaving the absolute value of the capacitor as a design parameter, greater design latitude is possible in the overall delta-sigma modulator design.

Further, a switched capacitor has an inherent sample and hold function at its input. Actually, the signals at all nodes in the circuit change at discrete instants of time. Consequently, the input to the comparator of the circuit is stable when the comparator makes a decision.

Basic circuitry, parameter identification and operational considerations are set forth in the detailed description of a preferred embodiment of the invention hereinafter presented.

BRIEF DESCRIPTION OF THE DRAWINGS

FIG. 3 is a schematic diagram of an implementation of the delta-sigma modulator according to the invention employing $+V$ and $-V$ reference voltages.

FIG. 4 is a timing waveform presentation for the circuit of FIG. 3.

DESCRIPTION OF THE PREFERRED EMBODIMENT

Figure 1:
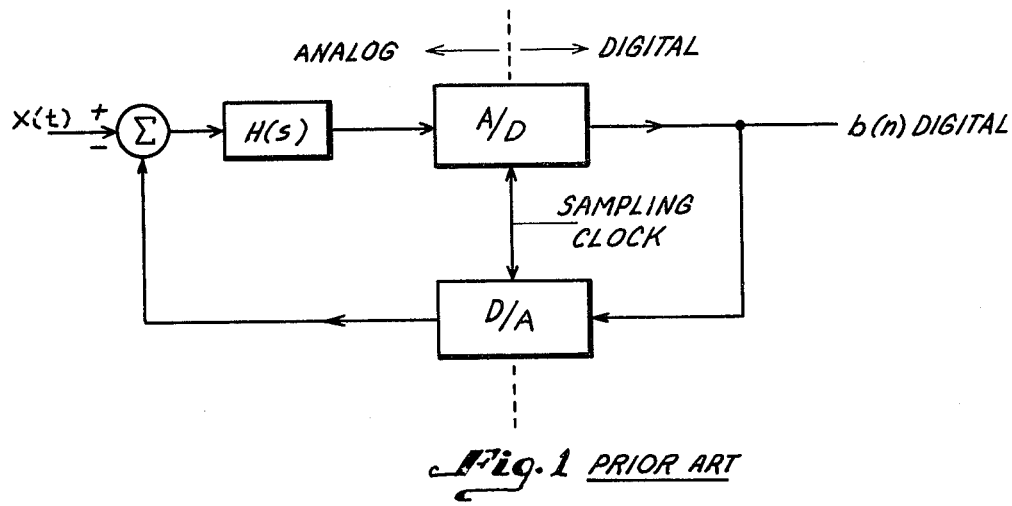
FIG. 1 is a schematic block diagram representative of typical analog implementations according to the prior art.

At the outset, it should be pointed out that the term delta-sigma modulator is sometimes called a sigma-delta modulator, the transposition of the sigma and delta terms being a matter of author's preference, the same device going under either name. FIG. 1 is prior art as aforementioned and substantially self-explanatory. In FIG. 1 herewith, the D/A converter would be a pulse shaper providing one of two different pulses in accordance with whether the digital signal is high or low, mathematically $+A$ or $-A$, the quantity A being related to the conversion between a number and a voltage. The basically lowpass (integrating) device labeled H(s) determines the order of the delta-sigma modulator. H(s) is typically a first order filter if H(s) is $=g/s$ and second order $$\text{if } H(S) = \frac{g(S + C)}{(s + a)(s + b)}$$

It may be said that the modulator noise (inaccuracy of conversion of the input function to a digital signal) reduction achieved by the ($\Delta\Sigma$) modulator is the result of keeping track of all previous conversion errors and feeding this information (as an error related signal) back to correct the next conversion. In this process, a first order modulator attempts to zero the average error over a period of time, whereas a second order modulator not only keeps this average error at zero but also keeps the first derivative of the error signal at zero.

In a first order system, only a DC input signal will be accurately represented digitally. However, in a second order system, the bandwidth of the signal which can be continuously represented digitally is increased.

According to known filter theory, the integrating filter H(S) can be described for a first order ($\Delta\Sigma$) modulator as:

$$H(s) = \frac{\alpha + \beta s}{1 + \eta s},$$

and similarly, for a second order filter $$H(s) = \frac{\alpha + \beta s + \delta s}{1 + \eta s + s^2} \gamma$$

Capacitor and other component values are chosen to give appropriate values for the coefficients. $\Delta\Sigma$ modulation performance in terms of noise and stability is related to these coefficients.

The paper "Reduction of Quantizing Noise by Use of Feedback" (paper No. 1) is a theoretical paper which provides the basis for $\Delta\Sigma$ Modulation. The second paper, "A Telemetering System by Code Modulation - $\Delta$ - $\Sigma$ Modulation" provides an implementation and the underlying analysis of a "first-order" $\Delta\Sigma$ modulator. FIG. 1 of paper 2 shows the "error signal", $S(t)-P(t)$ being applied to an integrator, which has a *first-order* transfer function and consequently is a "first-order $\Delta\Sigma$ M". FIG. 1 of paper 1 depicts the most general case of $\Delta\Sigma$M, in which each $H_i$ (filter transfer function) could be of order greater than 1 and further, considers a general, multilevel, quantizer characteristic. The authors of paper No. 1 have, most probably for simplicity of analysis, chosen to show the sampler and quantizer as distinct entities. This configuration *cannot* be implemented by conventional analog circuitry as, for example, described in paper No. 2. The sampler and quantizer *can*, however, be separated in a switched capacitor implementation as in the invention.

In FIG. 1 of paper No. 2, the sampling pulse generator and pulse modulator together form an A/D+D/A operation. The pulse modulator outputs a pulse of known shape whose polarity is determined by the polarity of the analog signal at the input of the pulse modulator at the instant the sampling pulse is asserted.

Prior art references, for the most part, describe circuits obtained experimentally—a circuit configuration is chosen, an initial "educated" guess of component values is made and the circuit is then refined on a lab bench.

Higher order $\Delta\Sigma$M's provide, potentially, better noise behavior but are notorious for being unstable and are consequently not recommended. The second order embodiment herein described is regarded as optimum.

Figure 2:
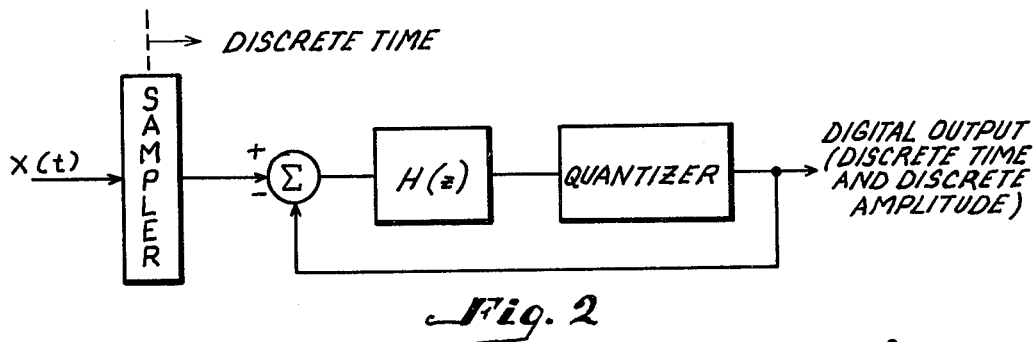
FIG. 2 is a schematic block diagram basically representative of switched capacitor implementations.

All switched capacitor implementations are generalized in FIG. 2 and can be, mathematically, reduced to the form shown below.

H(z) is a discrete-time transfer function, of the form for "second-order" $\Delta\Sigma$M:

$$H(z) = z^{-1} \left[ \frac{\alpha + \beta z^{-1} + \eta z^{-2}}{1 + \delta z^{-1} + z^{-2}} \right] \gamma$$

where $z^{-1}$ is the unit delay operator, unit delay being the time of one sampling interval. For a sampling rate of 1MHz, the sampling interval will be seen to be 1 $\mu$sec. The coefficients, which determine the noise performance and stability, are functions of capacitor ratios. The absolute value of each capacitor can be chosen by the circuit designer to optimize amplifier performance, to swamp stray capacitance, etc.

The switched capacitor $\Delta\Sigma$M according to the invention is best explained in stages. The principle underlying the operation of an $\Delta\Sigma$M is to provide an analog-to-digital conversion wherein the digital word size is small but the sampling frequency is much higher than the highest signal (speech) frequency.

First consider the sampling clock which operates the D type (edge-triggered) flip-flop, 20 in FIG. 3. This clock provides the time reference $f_s$ and also two other clock waveforms, at the sampling frequency, but with duty cycle less than 50%. These are designated $\theta_1$ ("charge") and $\theta_2$ ("discharge"). FIG. 4 depicts these waveforms in a typical relationship.

Consider next a section of FIG. 3 consisting of switches 1 and 3, capacitor C1, amplifier 4 and capacitor C3. Here $\theta_1$ from sampling clock 303 controls the switch 1 and $\theta_2$ controls the switch 3. When $\theta_1$ is low, switch 1 is open (open circuit) and when $\theta_1$ is high, switch 1 is closed (short-circuit). Similarly with $\theta_2$ and switch 3. The non-overlapping nature of $\theta_1$ and $\theta_2$ ensures that switches 1 and 3 will not both be closed at any time. Assuming the input signal u(t) remains constant over the interval [nT, (n+1)T], capacitor $C_1$ will charge during $\theta_1$, to a voltage equal to u(nT). Assuming the amplifier, 4, is an ideal op-amp, during $\theta_2$ all the charge on $C_1$ will be transferred to $C_3$, causing a change in the voltage across $C_3$ of $$-\left(\frac{C_1 u(nT)}{C_3}\right).$$

Consequently, at $t=(n+1)T$, the op-amp output voltage, x, will be $$x[(n+1)T] = x(nT) - (c_1/C_3) U(nT)$$

the negative increment is because the amplifier inverts. Now consider the addition of switches 6, 7 and 9 and capacitor $C_2$. If b(n) is +1, i.e., $Q_n$=HIGH, then during $\theta_1$, $C_2$ would charge to +V. In short $C_2$ would charge to $-b(n)\cdot V$. During $\theta_2$ this charge would be transferred to $C_3$. The overall operation of switches 1, 3, 6, 7 and 9 and capacitors $C_1$, $C_2$ and $C_3$, and amplifier 4 can be described by the equation:

$$x[(n+1)T] = X(nT) - (C_1/C_3) U(nT) + b(n)\cdot V\cdot(C_2/C_3)$$

similarly, $$W(n+1)T = W(nT) - (C_4/C_6) X(nT) - b(n)\cdot V\cdot(C_5/C_6)$$

The dotted enclosures 301 and 302 may be called reference switching means. The operation of the comparator and D flip-flop is to obtain $$b(n+1) = sqn\{W[(n+1)T]\}$$

The noise performance and stability of the $\Delta\Sigma$ modulator is governed by the capacitor ratios $(C_1/C_3)$, $(C_2/C_3)$, $(C_4/C_6)$ and $(C_5/C_6)$. The voltage V is termed the "reference voltage" and normally all voltages are evaluated as fractions thereof. V is sometimes referred to as the "crash point" of the encoder and is the maximum amplitude of the input signal. An input amplitude of greater than V will cause overload.

For a typical $\Delta\Sigma$ modulator, the following capacitor ratios were found to be satisfactory.

$$(C_1/C_2) = (C_2/C_3) = \tfrac{1}{2}$$

$$(C_4/C_6) = (C_5/C_6) = 1$$

It will be noted that the configuration of FIG. 3 requires *two* reference voltages, +V and −V. If only one reference, for example +V is available, then the configuration consisting of +V, −V, switches 6, 7 and 9 and capacitor $C_2$ (similarly with +V, −V, switches 13, 14, 16 and capacitor $C_5$) can be replaced by the circuit shown in FIG. 5 and included in FIG. 6 as dotted block 601.

In that variation, and during each sampling interval, $C_8$ charges to V during $\theta_1$ and during $\theta_2$ causes a change of $-(C_8/C_3) V$ in the output of amplifier 4. During $\theta_1$, $C_7$ charges to V volts with the polarity indicated shown on FIGS. 5 and 6. If $Q_n$ were "high", i.e., b(n)=+1, switches 23 and 22 would close during $\theta_2$ and, because of the polarity reversal, cause a change of $+(C_7/C_3)V$ in the output of amplifier 4. If b(n)=−1, then $C_7$ does not discharge into $C_3$. The net effect is then:

$$\text{if } b_n = +1 \; \Delta x = \left(\frac{C_7}{C_3} - \frac{C_8}{C_3}\right) V - \left(\frac{C_1}{C_3}\right) U(nT)$$

or $$\text{if } b_n = -1 \; \Delta x = -\left(\frac{C_8}{C_3}\right) V - \left(\frac{C_1}{C_3}\right) U(nT)$$

Figure 5:
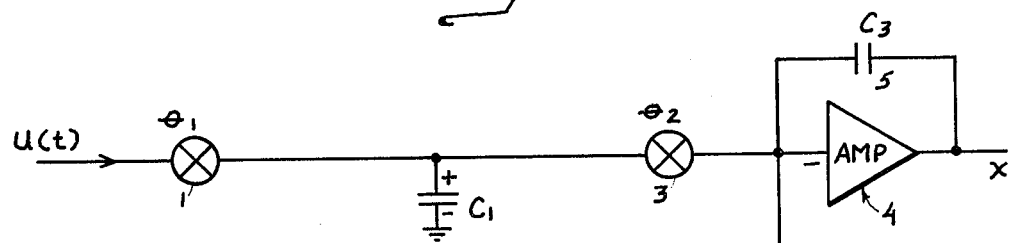
FIG. 5 shows a portion of a circuit of FIG. 4 with circuitry adapted to the use of a single reference voltage $+V$.
Figure 5:
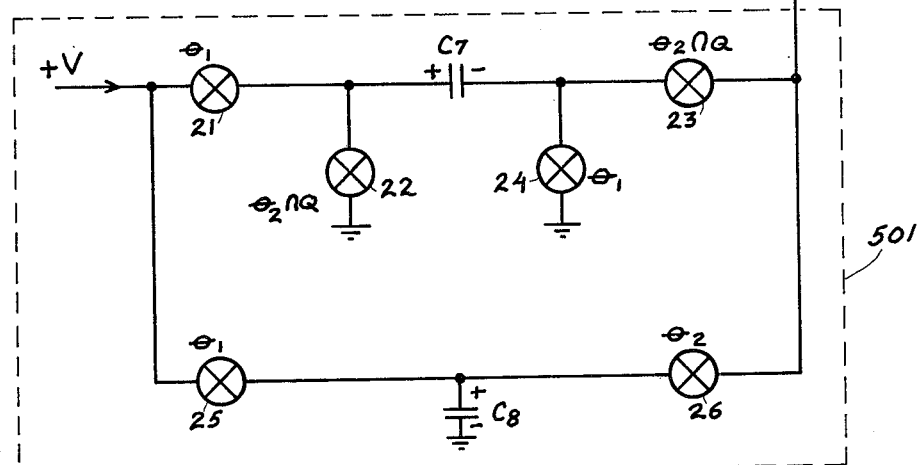

If $C_7 = 2C_8$, then the overall operation of the circuit in FIG. 5 can be described as $$x(n+1)T = x(nT) - (C_1/C_3) U(nT) + b(n) V\cdot(C_8/C_3)$$

similarly $$W(n+1)T = W(nT) - (C_4/C_6) x(nT) - b(n) V\cdot(C_{10}/C_6)$$

Figure 6:
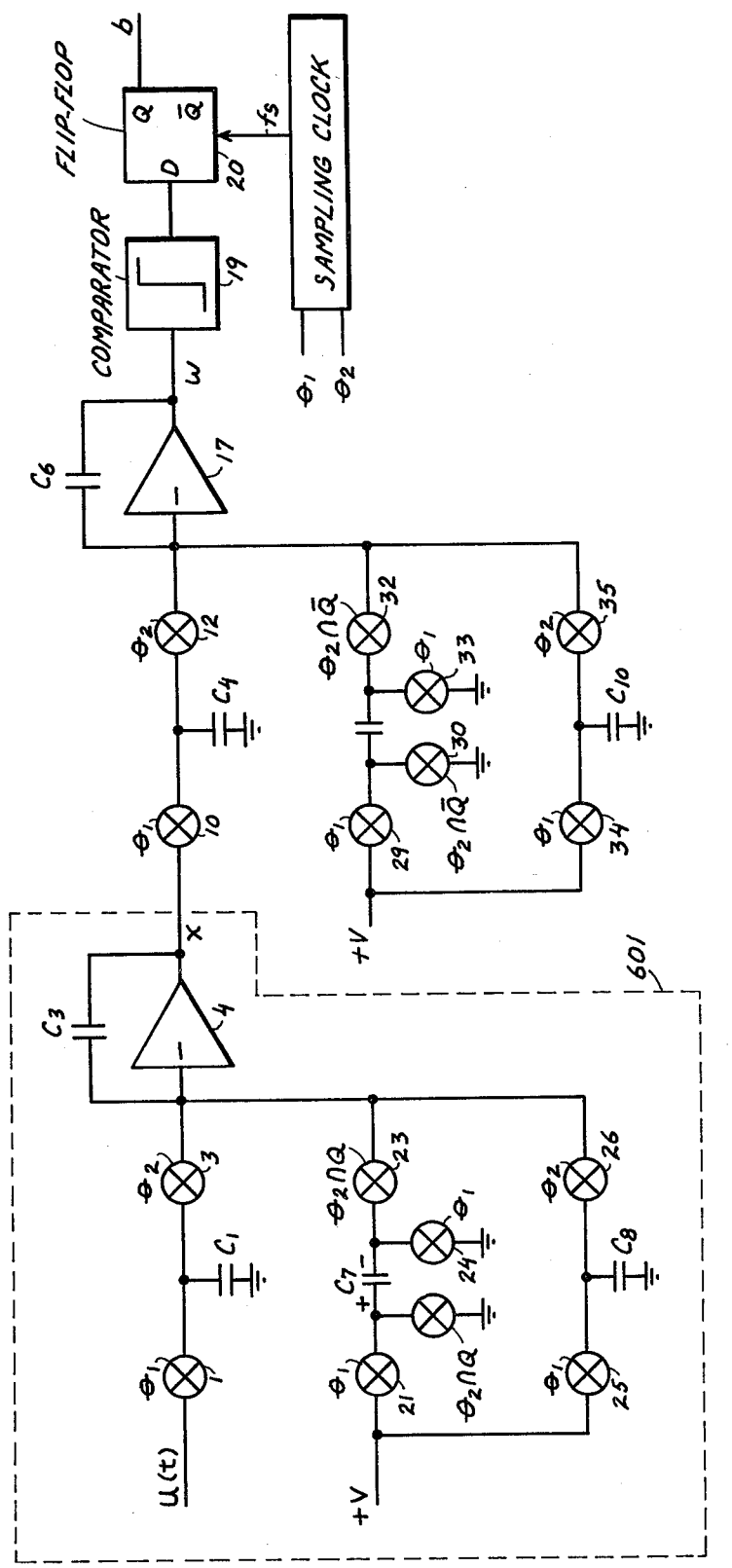
FIG. 6 illustrates the substitution of the single reference voltage circuitry of FIG. 5 into the device of FIG. 3.

Implementing the $\Delta\Sigma$ modulator of the invention according to FIG. 6, the following capacitor ratios would be used:

$$(C_8/C_3) = (C_1/C_3) = \tfrac{1}{2}$$

$$(C_4/C_6) = (C_{10}/C_6) = 1$$

$$(C_7/C_8) = (C_9/C_{10}) = 2$$

The sampling rate must be much higher than the highest frequency component of the input signal U(t). The invention is particularly useful for digitally encoding telephone (speech) band signals for transmission through a discrete telephonic channel. Since such signals require only a few KHz of bandwidth, and accordingly the sampling rate of 1 MHz typical for the modulator of the invention fulfills the aforementioned requirement. A second order $\Delta\Sigma$ modulator can be considered to be constructed of a first order $\Delta\Sigma$ modulator embedded in a feedback loop. Conversely, a first order $\Delta\Sigma$ modulator can be considered to be a subset of a second order $\Delta\Sigma$ modulator obtained by "stripping" the second order $\Delta\Sigma$ modulator down. The configuration shown in FIG. 6 can be stripped down to form a first order switched capacitor $\Delta\Sigma$ modulator. If amplifier 4, capacitors $C_3$, $C_1$, $C_2$ and their associated switches are removed, what remains is a first order $\Delta\Sigma$ modulator which converts an analog signal at U into a digital signal b(n).

It is possible to transmit the bit-stream {b(n)} as is and at the receiving end have a simple digital-to-analog converter which comprises of a pulse shaper which puts out distinct waveforms in a bit-interval according as b(n)="HIGH" or b(n)="LOW" followed by a simple analog lowpass filter to smooth the waveform. This, however, would entail the transmission of {b(n)} directly, which is about 1 megabit/sec which is quite high. An alternative method, is to employ a sequence of digital lowpass filters which do the "smoothing" while retaining the digital nature of the signal. As a consequence, the number of bits per word increases, that is the granularity of levels, which can be represented, is made fine. In a line circuit such as that of U.S. Pat. No. 4,270,027 as aforementioned, the lowpass filters permit the resampling of the digital signal at 8 Kilowords per sec with a granularity corresponding to 13 bits per word in a uniform code. Each code word can be converted into an 8-bit code, if so desired, corresponding to either the A-law or $\mu$-law format. The 1-bit device, in this sense, does represent a large range of sample values from u(nt). The 1-bit/word, 1 Mword/sec stream (i.e. a 1-Megabit/sec stream) is sometimes referred to in the art as "PULSE-DENSITY MODULATED" version of the complex voice channel signal.

While the present invention has been described in connection with a preferred embodiment thereof, it is to be understood that the invention is not limited to telephone system implementations, and that additional embodiments, modifications and application which will become obvious to those skilled in the art are included within the spirit and scope of the invention as set forth by the claims appended hereto.

We claim:

1. A delta-sigma modulator for digitally encoding an analog signal, comprising:
   means for generating a timing waveform having a frequency substantially higher than the highest frequency component of said analog signal;
   sampling means including switching capacitance means for storing charge representative of instantaneous amplitude values of said analog signal said values being determined by the ratios of the values of a plurality of said capacitance means, and having an output;
   lowpass filter means for performing an integration function on the output of said sampling means;
   one-bit analog-to-digital converter means clocked by said timing waveform and providing first and second outputs in response to the instantaneous polarity of the output of said lowpass filter means, said second output being complementary of said first output;
   reference means for selectively applying a charging voltage to said lowpass filter such that said capacitance means charges and discharges in non-overlapping intervals of time.

2. A modulator according to claim 1 wherein said one-bit analog-to-digital converter includes a comparator having a stabilized input voltage during the interval when a comparison of voltages is made.

3. A Delta-Sigma $\Delta\Sigma$ modulator for digitally encoding an analog input signal, comprising:
   clock means for generating a recurring timing gate waveform having first and second levels and first and second switching gates within the duration of but not overlapping said timing gate first and second levels, respectively, said timing gate and said switching gates having a frequency high compared to the highest frequency component of said analog signal;
   a first sampling circuit including switching means and a first capacitor for storing the instantaneous amplitude value of said analog input signal during said first switching gate and for outputting said stored amplitude value during said second switching gate;
   first integrating means operative as a first low-pass filter responsive to the output of said first means;
   a second sampling circuit including a second capacitor and switching means for storing the instantaneous amplitude value of the output signal of said first integrating means during said first switching gate and for outputting said stored amplitude value during said second switching gate;
   second integrating means operative as a second low-pass filter responsive to the output of said second sampling circuit;
   a one-bit analog-to-digital converter clocked by said timing gate waveform and providing Q and $\overline{Q}$ outputs as a function of the corresponding instantaneous polarity of the output signal of said second integrating means;
   reference means including a third capacitor and additional switching means connected to charge said third capacitor to $+V$ or $-V$ reference voltage during said first switching gate in polarity corresponding to $\theta_n\overline{Q}$ or $\theta_1 nQ$, respectively, where $\theta_1$ is said first switching gate and $\theta_2$ is said second switching gate and to apply said third capacitor voltage to said first integrating means input during said $\theta_2$ time;
   and second reference means including a fourth capacitor and second additional switching means connected to charge said fourth capacitor to $+V$ or $-V$ reference voltage during said first switching signal in polarity corresponding to $\theta_1 nQ$ or $\theta_1 nQ$, respectively, and to apply said fourth capacitor voltage to said second integrating means input during said $\theta_2$ time.

4. The modulator according to claim 3 in which said first and second integrators comprise corresponding inverting first and second operational amplifiers having fifth and sixth capacitors, connected between input and output of said first and second amplifiers, respectively.

5. The modulator according to claim 4 in which the ratio of the capacitance of said first capacitor to that of said third capacitor, and the capacitance ratio of said third capacitor to that of said fifth capacitor is approximately $\frac{1}{2}$; the ratio of the capacitance of said second capacitor to that of said sixth capacitor and the capacitance ratio of said fourth capacitor to that of said sixth capacitor being unity.

6. The modulator according to claim 4 wherein the ratio of capacitances is selectively variable.

7. The modulator according to claim 5 in which said first reference means includes additional switch means associated with said third capacitor for switching the terminal of said third capacitor which is connected to ground potential to the positive terminal thereof during the time of $\theta_2 nQ$ and to the negative terminal thereof during $\theta_1$, said third capacitor voltage being outputted to said first integrating means during $\theta_2 nQ$, said second reference means comprising second additional switch means associated with said fourth capacitor for switching the terminal thereof which is connected to ground potential to the positive terminal thereof during the time $\theta_2 n\overline{Q}$ and to the negative terminal during $\theta_1$, said fourth capacitor voltage being outputted to said second integrating means during $\theta_2 n\overline{Q}$, thereby to provide the function of said reference means using only a positive reference voltage.

8. The modulator according to claim 3 in which said first reference means includes additional switch means associated with said third capacitor for switching the terminal of said third capacitor which is connected to ground potential to the positive terminal thererof during the time of $\theta_2nQ$ and to the negative terminal thereof during $\theta_1$, said third capacitor voltage being outputted to said first integrating means during $\theta_2nQ$, said second reference means comprising second additional switch means associated with said fourth capacitor for switching the terminal thereof which is connected to ground potential to the positive terminal thereof during the time $\theta_2n\overline{Q}$ and to the negative terminal during $\theta_1$, said fourth capacitor voltage being outputted to said second integrating means during $\theta_2n\overline{Q}$, thereby to provide the function of said reference means using only a positive reference voltage.

9. The modulator according to claim 8 in which said one-bit analog-to-digital converter comprises a comparator responding to said second integrator to provide a polarity responsive output having a first or second condition, and a D type flip flop circuit responsive to said comparator output for providing Q and $\overline{Q}$ outputs, said Q output providing the one-bit code.

10. The modulator according to claim 8 in which said switching means comprise individual signal controlled electronic switches.

11. The modulator according to claim 3 in which said one-bit analog-to-digital converter comprises a comparator responding to said second integrator to provide a polarity responsive output having a first or second condition, and a D type flip-flop circuit responsive to said comparator output for providing Q and $\overline{Q}$ outputs, said Q output providing the one-bit code.

12. The modulator according to claim 3 in which said clock means is further defined as generating said switching gates each substantially time-centered within the duration of the corresponding timing gate.

13. The modulator according to claim 3 in which said switching means comprise individual signal controlled electronic switches.

* * * * *